(12) United States Patent
Wuister

(10) Patent No.: US 9,588,422 B2
(45) Date of Patent: Mar. 7, 2017

(54) IMPRINT LITHOGRAPHY

(75) Inventor: Sander Frederik Wuister, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 740 days.

(21) Appl. No.: 12/891,397

(22) Filed: Sep. 27, 2010

(65) Prior Publication Data

US 2011/0076351 A1 Mar. 31, 2011

Related U.S. Application Data

(60) Provisional application No. 61/246,725, filed on Sep. 29, 2009.

(51) Int. Cl.
| | |
|---|---|
| *B29C 59/02* | (2006.01) |
| *C03C 25/68* | (2006.01) |
| *G03F 7/00* | (2006.01) |
| *B29C 43/02* | (2006.01) |
| *B82Y 10/00* | (2011.01) |
| *B82Y 40/00* | (2011.01) |

(52) U.S. Cl.
CPC .......... *G03F 7/0002* (2013.01); *B29C 43/021* (2013.01); *B82Y 10/00* (2013.01); *B82Y 40/00* (2013.01)

(58) Field of Classification Search
CPC . B29C 33/424; B39C 33/3842; B81C 1/0046; G03F 7/0002
USPC ............... 264/219, 220, 225, 226, 227, 299; 425/385; 216/95, 102, 41, 44, 52, 59, 67, 216/72, 74, 77, 79, 8–11
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,334,960 B1 | 1/2002 | Willson et al. | |
| 6,818,139 B1 * | 11/2004 | Lee et al. ......................... | 216/49 |
| 7,150,844 B2 * | 12/2006 | Deeman et al. ............... | 264/220 |
| 7,341,825 B2 * | 3/2008 | Bandic ................... | B82Y 10/00 |
| | | | 216/11 |
| 7,914,693 B2 | 3/2011 | Jeong et al. | |

(Continued)

FOREIGN PATENT DOCUMENTS

| | | |
|---|---|---|
| JP | 59-224320 | 12/1984 |
| JP | 2003-103525 | 4/2003 |

(Continued)

OTHER PUBLICATIONS

J. Haisma, "Mold-Assisted Nanolithography: A Process for Reliable Pattern Replication," *J. Vac. Sci. Technol.* B 14(6), pp. 4124-4127, Nov./Dec. 1996.

(Continued)

*Primary Examiner* — Nahida Sultana
(74) *Attorney, Agent, or Firm* — Pillsbury Winthrop Shaw Pittman LLP

(57) ABSTRACT

A method of forming an imprint template using a substrate having an inorganic release layer and a layer of imprintable medium is disclosed. The method includes using a master imprint template to imprint a pattern into the imprintable medium, causing the imprintable medium to solidify, and etching the imprintable medium and the inorganic release layer to form a pattern in the inorganic release layer.

18 Claims, 3 Drawing Sheets

(56) References Cited

U.S. PATENT DOCUMENTS

| | | | |
|---|---|---|---|
| 8,043,516 B2 * | 10/2011 | Kimura | G11B 5/855 216/22 |
| 8,147,742 B2 * | 4/2012 | Chen et al. | 264/317 |
| 8,282,381 B1 * | 10/2012 | Zhu et al. | 425/385 |
| 8,318,253 B2 * | 11/2012 | Verschuuren et al. | 427/256 |
| 8,329,089 B2 * | 12/2012 | Kim et al. | 264/496 |
| 8,480,936 B2 * | 7/2013 | Kim et al. | 264/225 |
| 8,790,561 B2 * | 7/2014 | Mahnad et al. | 264/219 |
| 2003/0205061 A1 * | 11/2003 | Elledge | 65/102 |
| 2004/0124566 A1 | 7/2004 | Sreenivasan et al. | |
| 2005/0116387 A1 * | 6/2005 | Davison | H05K 3/005 264/293 |
| 2005/0192421 A1 * | 9/2005 | Xu | B82Y 10/00 528/23 |
| 2005/0274693 A1 | 12/2005 | Heidari et al. | |
| 2005/0275944 A1 * | 12/2005 | Wang | B82Y 20/00 359/576 |
| 2006/0216413 A1 * | 9/2006 | Saito et al. | 427/162 |
| 2007/0051697 A1 * | 3/2007 | DiPietro et al. | 216/52 |
| 2007/0138699 A1 * | 6/2007 | Wuister | B82Y 10/00 264/319 |
| 2007/0158872 A1 | 7/2007 | Jeong et al. | |
| 2007/0264591 A1 | 11/2007 | Wuister et al. | |
| 2007/0275332 A1 * | 11/2007 | Bandic et al. | 430/320 |
| 2007/0284777 A1 * | 12/2007 | Kim et al. | 264/225 |
| 2008/0011934 A1 | 1/2008 | Verschuuren et al. | |
| 2008/0047932 A1 * | 2/2008 | Terasaki et al. | 216/41 |
| 2008/0106001 A1 * | 5/2008 | Slafer | B29C 33/30 264/310 |
| 2008/0107973 A1 * | 5/2008 | Hattori | B82Y 10/00 430/5 |
| 2008/0187719 A1 | 8/2008 | Uchida | |
| 2008/0211133 A1 * | 9/2008 | Terasaki et al. | 264/219 |
| 2008/0248334 A1 * | 10/2008 | Moriwaki et al. | 428/817 |
| 2009/0023288 A1 * | 1/2009 | Jeong et al. | 438/670 |
| 2009/0053655 A1 * | 2/2009 | Deng et al. | 430/321 |
| 2009/0115094 A1 * | 5/2009 | Chou | B01L 3/502707 264/219 |
| 2009/0169663 A1 | 7/2009 | Houle et al. | |
| 2009/0246310 A1 * | 10/2009 | Sakurai et al. | 425/470 |
| 2010/0092599 A1 * | 4/2010 | Selinidis | B82Y 10/00 425/470 |
| 2010/0108638 A1 * | 5/2010 | Gavillet et al. | 216/41 |
| 2010/0258966 A1 * | 10/2010 | Sandhu | 264/104 |
| 2010/0308496 A1 * | 12/2010 | Uchida | 264/220 |
| 2010/0308512 A1 * | 12/2010 | Zhu et al. | 264/496 |
| 2011/0262580 A1 * | 10/2011 | Sakurai et al. | 425/385 |
| 2013/0106015 A1 * | 5/2013 | Mahnad et al. | 264/219 |
| 2013/0228950 A1 * | 9/2013 | DeSimone et al. | 264/226 |
| 2014/0113020 A1 * | 4/2014 | Kureishi | B82Y 10/00 425/385 |
| 2014/0151733 A1 * | 6/2014 | Koike et al. | 257/98 |
| 2014/0234468 A1 * | 8/2014 | Taniguchi | G11B 5/855 425/385 |

FOREIGN PATENT DOCUMENTS

| | | |
|---|---|---|
| JP | 2004-311713 | 11/2004 |
| JP | 2005-193390 | 7/2005 |
| JP | 2005-286222 | 10/2005 |
| JP | 2007-116163 | 5/2007 |
| JP | 2007-307899 | 11/2007 |
| JP | 2008-068611 | 3/2008 |
| JP | 2008-221491 | 9/2008 |
| JP | 2009-117588 | 5/2009 |
| WO | 02/067055 | 8/2002 |
| WO | WO2006/041645 A2 * | 4/2006 |

OTHER PUBLICATIONS

F. Houle, et al., "Metal-containing release layers for use with UV-cure nanoimprint lithographic template materials," *J. Vac. Sci. Technol.* B 26, (2008), pp. 1301-1304.

F. Houle, et al., "Chemical and mechanical properties of UV-cured nanoimprint resists and release layer interactions", *Proc. of SPIE*, vol. 6921, (2008), pp. 1-6.

Japanese Office Action mailed Sep. 13, 2011 in corresponding Japanese Patent Application No. 2010-211473.

* cited by examiner

IMPRINT LITHOGRAPHY

This application claims priority and benefit under 35 U.S.C. §119(e) to U.S. Provisional Patent Application No. 61/246,725, entitled "Imprint Lithography", filed on Sep. 29, 2009. The content of that application is incorporated herein in its entirety by reference.

FIELD

The present invention relates to a method of forming an imprint template which is suitable for use in imprint lithography, and to an imprint template suitable for use in imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g., nanometer sized features or sub micron sized features) that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve bringing together a patterned surface of an imprint template and a layer of imprintable medium (e.g., moving the imprint template toward the imprintable medium, or moving the imprintable medium toward the imprint template, or both) such that the imprintable medium flows into recesses in the patterned surface and is pushed aside by protrusions on the patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint template and the patterned imprintable medium are then separated. The substrate and patterned imprintable medium are then typically processed further in order to pattern or further pattern the substrate. The imprintable medium is typically provided in the form of droplets on the surface of a substrate to be patterned, but may alternatively be provided using spin coating or the like.

SUMMARY

It is conventional to form an imprint template using electron-beam (e-beam) writing. A problem arising from this approach is that forming an imprint template using e-beam writing may be slow and/or expensive.

According to an aspect, there is provided a method of forming an imprint template using a substrate having an inorganic release layer and a layer of imprintable medium, the method comprising using a master imprint template to imprint a pattern into the imprintable medium, causing the imprintable medium to solidify, and etching the imprintable medium and the inorganic release layer to form a pattern in the inorganic release layer.

According to an aspect, there is provided an imprint template comprising a substrate and an inorganic release layer, a pattern being present in the inorganic release layer, the pattern having been formed in the inorganic release layer using etching.

BRIEF DESCRIPTION OF THE DRAWINGS

Specific embodiments of the invention will be described with reference to the accompanying figures, in which.

DETAILED DESCRIPTION

Figure 1A:
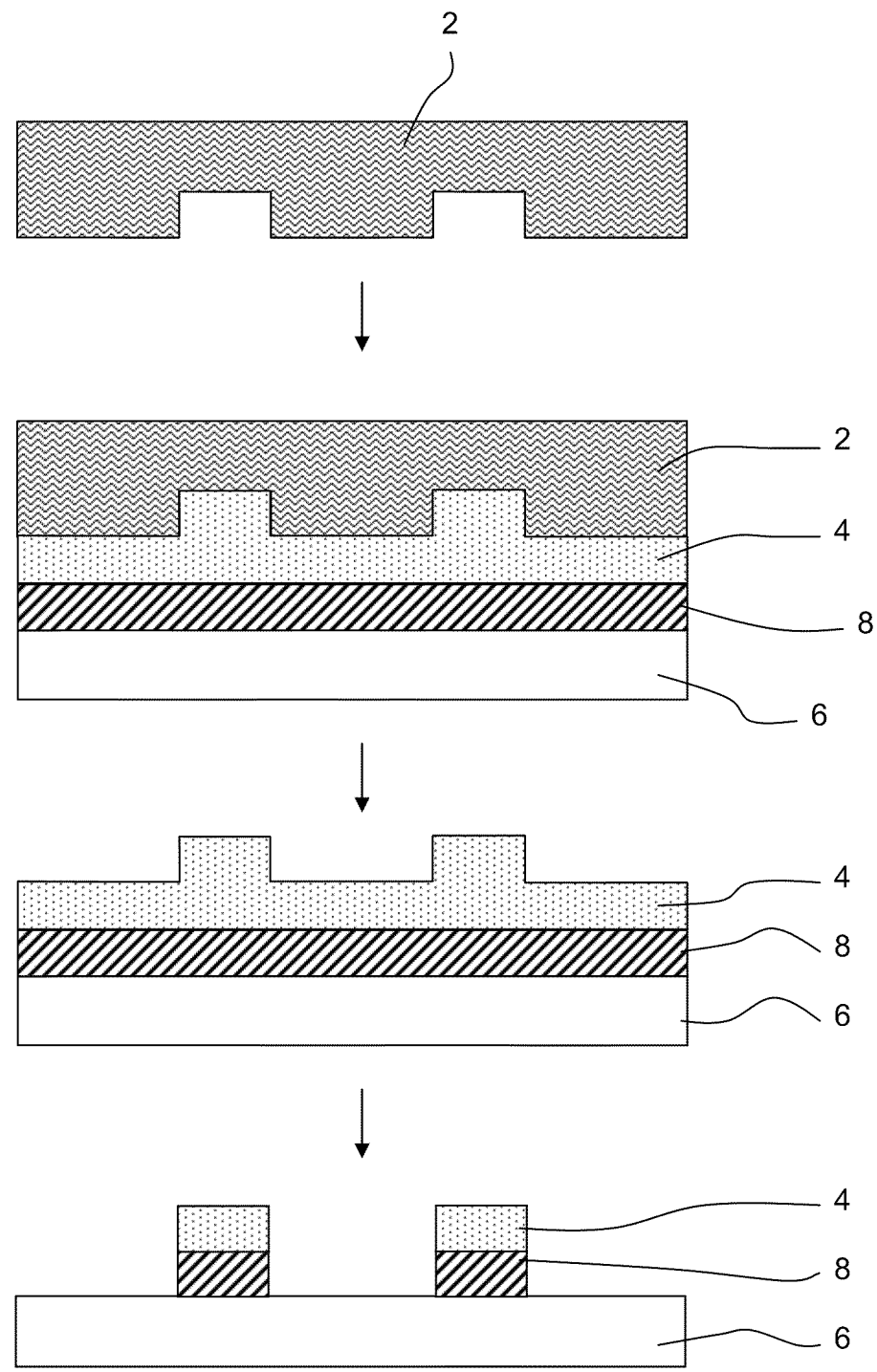
FIGS. 1a and 1b schematically depict examples of, respectively, hot imprint, and UV imprint lithography.
Figure 1B:
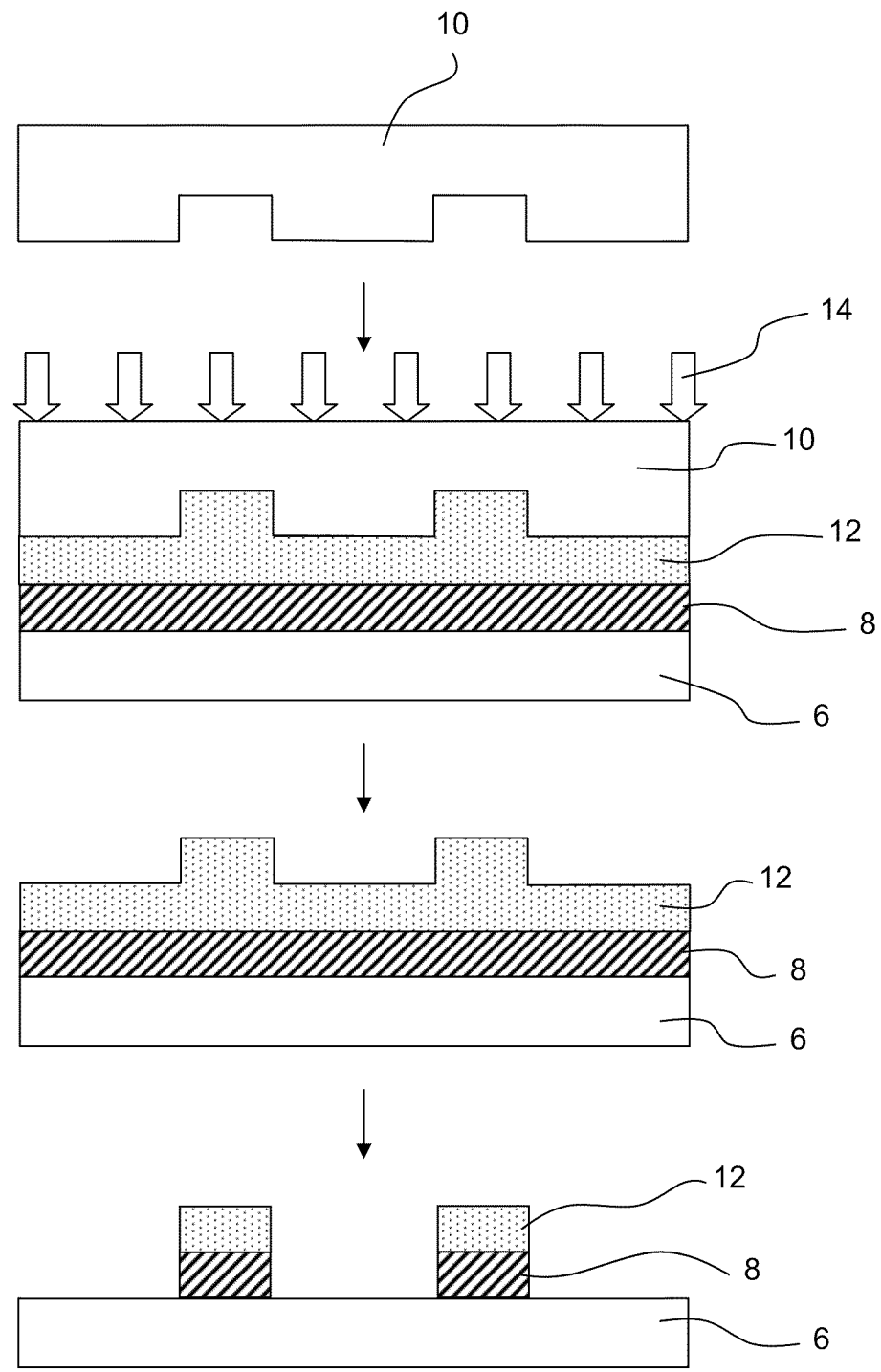

Examples of approaches to imprint lithography are schematically depicted in FIGS. 1a to 1b.

FIG. 1a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may for example be resin. The imprintable medium may for instance be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is pressed into the flowable resin and then cooled to below its glass transition temperature with the template 2 in place to solidify the pattern. Thereafter, the template 2 is removed. The pattern will consist of the features in relief from a residual layer of the imprintable medium which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1b shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable resin 12 in a similar manner to the process of FIG. 1a. However, instead of using heat or temperature cycling as in hot imprint, the pattern is solidified by curing the imprintable medium 12 with UV radiation 14 that is applied through the quartz template 10 onto the imprintable medium 12. After removal of the template 10, the imprintable medium 12 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Figure 2:
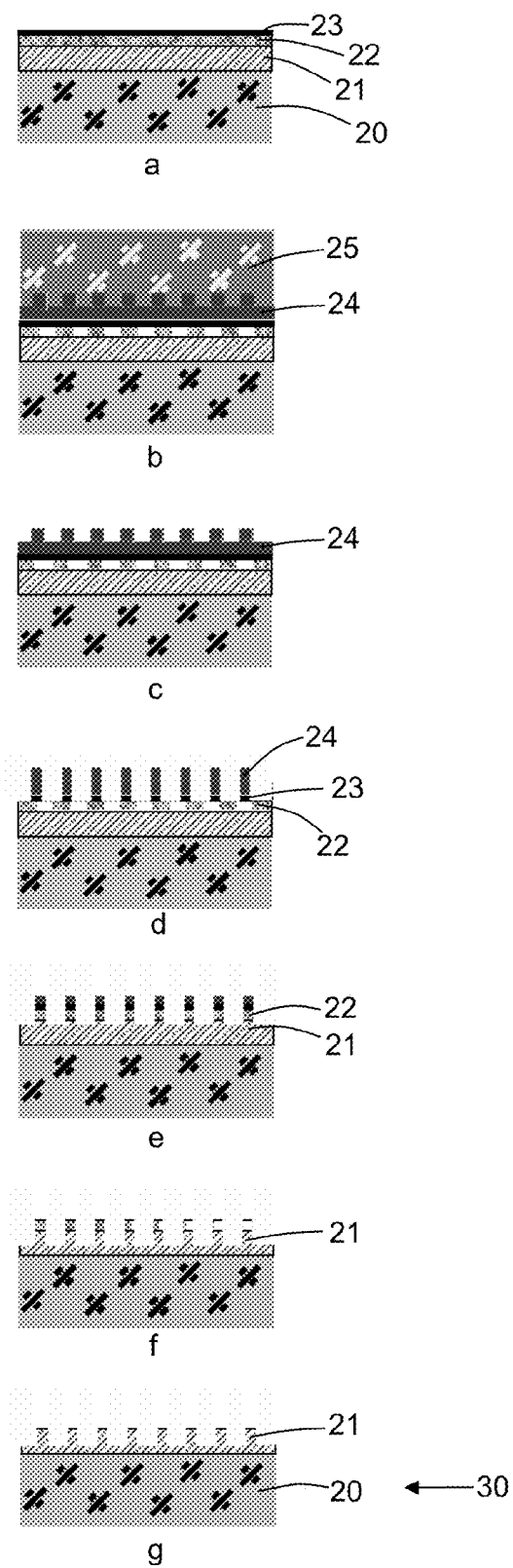
FIG. 2 schematically depicts a method of forming an imprint template according to an embodiment of the invention.

FIG. 2 shows schematically a method of forming an imprint template according to an embodiment of the invention.

Referring to FIG. 2a, a quartz substrate 20 is provided with an inorganic release layer 21 (e.g. silicon nitride). The inorganic release layer 21 may be applied via, for example, chemical vapor deposition, physical vapor deposition or atomic layer deposition. A hard mask 22 (e.g. Cr) is provided on top of the inorganic release layer 21. An adhesion layer 23 (e.g. hexamethyldisilazane (HDMS)) is provided on top of the hard mask 22.

Referring to FIG. 2b, a layer of imprintable medium 24 is provided on top of the adhesion layer 23. An imprint template 25 is then brought into contact with the layer of imprintable medium 24. The imprint template 25 is hereafter referred to as the master imprint template 25. Imprintable medium 24 flows into recesses of a pattern provided on the lowermost surface of the master imprint template 25. The imprintable medium 24 is then cured, for example by exposing the imprintable medium to actinic radiation. The imprintable medium 24 may alternatively be solidified in some other manner, for example by heating or cooling the imprintable medium.

Referring to FIG. 2c, the master imprint template comes out of contact with the imprintable medium 24. As can be seen from FIG. 2c, the imprintable medium 24 retains a pattern which has been formed by the master imprint template.

Referring to FIG. 2d, the imprintable medium 24 and the adhesion layer 23 are etched. The etch, which may be referred to as a breakthrough etch, etches through the imprintable medium 24 and the adhesion layer 23, but desirably stops at the hard mask 22. The etch may be, for example, a dry etch, which uses an appropriate gas (examples of which are given further below). The etch is anisotropic, for example etching substantially only in the vertical direction in FIG. 2d. As a result of the etch, a pattern remains in the imprintable medium 24 and the adhesion layer 23, which corresponds to the pattern formed by the master imprint template 25.

Referring to FIG. 2e, a second etch is then performed. This second etch, which may be referred to as a hard mask etch, etches through those portions of the hard mask 22 which are not covered by the imprintable medium 24 and adhesion layer 23. Thus, the pattern which was formed by the master imprint template 25 is etched into the hard mask 22. The etch through the hard mask 22 breaks through the hard mask to the inorganic release layer 21. The etch may also etch into the inorganic release layer 21, thereby forming the pattern in the inorganic release layer. The etch may be, for example, a dry etch, which uses an appropriate gas (examples of which are given further below). The etch is anisotropic, for example etching substantially only in the vertical direction in FIG. 2e.

Referring to FIG. 2f, a third etch is then performed. This third etch etches into those portions of the inorganic release layer of 21 which are not covered by the hard mask 22. The etch does not etch fully through the inorganic release layer 21, but instead only etches partially through the inorganic release layer. The etch may be, for example, a dry etch, which uses an appropriate gas (examples of which are given further below). The etch is anisotropic, for example etching substantially only in the vertical direction in FIG. 2f. As a result of the etch, as can be seen in FIG. 2f, the pattern is etched into the inorganic release layer 21. The pattern formed in the inorganic release layer 21 corresponds to the pattern which was formed by the master imprint template 25 in the imprintable medium 24.

The imprintable medium 24 may be removed prior to performing the etch described in relation to FIG. 2f. This may be done, for example, using either a dry etch or a wet etch.

Referring to FIG. 2g, a fourth etch is then performed. This fourth etch removes the hard mask 22, and any remaining parts of the adhesion layer 23 and imprintable medium 24. The etch may be, for example, a wet etch, which uses an appropriate liquid (examples of which are given further below). The etch may be isotropic. The etch may, for example, dissolve the hard mask 22, thereby removing the hard mask and allowing any remaining parts of the adhesion layer 23 and imprintable medium 24 to be removed.

As can be seen from FIG. 2g, the method of the embodiment of the invention provides a quartz imprint template 30 which bears a pattern. The quartz imprint template 30 comprises a quartz substrate 20 which is not patterned, and an inorganic release layer 21 which is patterned. This differs from a conventional quartz imprint template, where the quartz itself is patterned, and an inorganic release layer is provided as a layer with a substantially constant thickness on top of the pattern.

The pattern formed in the inorganic release layer 21 is the inverse of the pattern of the master imprint template 25. Therefore, in order to provide a desired pattern in the inorganic release layer 21, the inverse of the desired pattern may be provided on the master imprint template 25. In an alternative arrangement, one or more of the material layers (e.g., the imprintable medium) may be arranged to support an inverse etching process in which recessed parts of the pattern are not etched (a process known as reverse SFIL, reverse-tone etching, or SFIL-R). Where this is done, the pattern on the master imprint template may correspond with the desired pattern, rather than being an inverse of the desired pattern.

The method may be repeated a plurality of times using the same master imprint template 25, thereby forming a plurality of imprint templates. More than one master imprint template 25 bearing the same pattern may be provided.

The embodiment of the invention provides a method of forming a plurality of imprint templates 30 with an inorganic release layer 21. The method does not require that the imprint templates 30 be formed using e-beam writing, as is seen in many prior art methods of forming imprint templates. Instead, the master imprint template 25 is used to provide the pattern for the imprint template 30. The master imprint template 25 may be formed using any suitable method. For example, the master imprint template 25 may be formed using e-beam writing. Although this is a relatively slow and expensive process, once the master imprint template 25 has been formed, the master imprint template can then be used to form a multiplicity of imprint templates 30. The embodiment of the invention thus allows a multiplicity of imprint templates with an inorganic release layer to be created at relatively low cost (compared with using e-beam writing to write each imprint template). This may be useful, for example, if it is desired to perform parallel imprinting with several imprint templates. It may be useful if it is desired to provide a stock of spare imprint templates.

The embodiment of the invention provides an imprint template 30 with a patterned inorganic release layer 21. Providing a patterned inorganic release layer is advantageous compared with providing an organic release layer. This is because an organic release layer tends to suffer from damage during use, and thus tends to wear out over time. The inorganic release layer 21 is less susceptible to damage than an organic release layer, and should last significantly longer. One or more advantages of an inorganic release layer are described in for example Houle et al., J. Vac. Sci. Tech. B 2008 26 1301, and Proc. of SPIE 2008 Vol. 6921.

Embodiments of the invention are advantageous because they provide the inorganic release layer 21 prior to patterning of the imprint template (rather than providing the inorganic release layer after the imprint template has been patterned). Since the inorganic release layer is provided on a flat surface, it may be possible to provide the inorganic release layer with a lower porosity and less defects than if the release layer had been provided on a patterned surface.

The breakthrough etch described above in relation to FIG. 2d etches through the imprintable medium 24 and the adhesion layer 23, but stops at the hard mask 22. In an alternative embodiment, the breakthrough etch may also etch through the hard mask 22. Thus, the etches described in relation to FIGS. 2d and 2e may be combined as a single etch.

The etch described in relation to FIG. 2f etches into the inorganic release layer 21. In some instances this etch may be combined with the etch described in relation to FIG. 2e, which etches into the hard mask 22. In some instances, the etches described in relation to FIGS. 2d, 2e and 2f may be combined as a single etch.

The adhesion layer 23 is intended to assist in retaining the imprintable medium 24. For example, the adhesion layer 23 may assist in ensuring that the imprintable medium 24 remains in place when the master imprint template 25 is removed from the imprintable medium. In some instances, adhesion of the imprintable medium 24 to the hard mask 22 may be sufficiently good that the adhesion layer 23 is not required.

The adhesion layer 23 may be, for example, a polymer which is spin-coated onto the hard mask 22, or may be, for example, HDMS which is applied as a monolayer onto the hard mask.

The hard mask 22 may be formed from a material which etches more slowly than the inorganic release layer 21 (or does not etch at all during etching of the inorganic release layer). The hard mask 22 may thus allow features to be formed in the inorganic release layer 21 which have a greater depth than would be the case if the hard mask 22 was not present. Thus, embodiments of the invention may omit the hard mask, although this may limit the depth of features which are formed in the inorganic release layer 21.

The hard mask 22 may be, for example, formed from Cr, in which case the hard mask etch referred to in relation to FIG. 2e may use, for example, an oxygen/chlorine plasma ($O_2/Cl_2$). The hard mask 22 may be, for example, formed from Mo, in which case the hard mask etch may use, for example, $CF_4/O_2$ plasma. The hard mask 22 may be, for example, formed from WSi, in which case the hard mask etch may be, for example, fluorine based. The hard mask 22 may be, for example, formed from W, in which case the hard mask etch may use, for example, $SF_6$ or $SF_6/O_2$. The hard mask 22 may be, for example, formed from Al, in which case the hard mask etch may be, for example, chlorine based. The hard mask 22 may be, for example, formed from Ti, in which case the hard mask etch may use, for example, $Ar/CHF_3$.

If a wet etch liquid is used to dissolve the hard mask 22, the wet etch liquid will depend upon the material used to form the hard mask. If the hard mask is formed, for example, from Cr, then the wet etch may use, for example, HCl or an acetic acid/ceric ammonium nitrate mixture. If the hard mask is formed, for example, from W, then the wet etch may use, for example, a mixture of ferricyanide and phosphorous acid. If the hard mask is formed, for example, from Al, then the wet etch may use, for example, a mixture of $H_3PO_4HNO_3$ and acetic acid. If the hard mask is formed, for example, from Ti, then the wet etch may use, for example, use HF and $H_2SO_4$.

The inorganic release layer may be chemically inert. The inorganic release layer may be mechanically inert. The inorganic release layer may be formed from a ceramic (for example a metal oxide or a metal nitride).

The inorganic release layer 21 may be, for example, formed from $SiN_x$, in which case the inorganic release layer etch referred to in relation to FIG. 2f may use, for example, $SF_6$ or $SF_6/O_2$. The inorganic release layer 21 may be, for example, formed from $AlN_x$, in which case the inorganic release layer etch may use, for example, $BCl_3/Cl_2/Ar$. The inorganic release layer 21 may be, for example, formed from $TiN_x$, in which case the inorganic release layer etch may use, for example, $Ar/CHF_3$, $Ar/Cl_2$, and $Ar/BCl_3$. The inorganic release layer 21 may be, for example, formed from $TiO_x$, $AlO_x$, or $TaO_x$, in which case the inorganic release layer etch may use, for example, $CF_4$. The inorganic release layer 21 may be, for example, formed from $GaN_x$, in which case the inorganic release layer etch may use, for example, $Ar/BCl_3/Cl_2$.

In the above described examples, the substrate 20 is formed from quartz. However, the substrate may be formed from any suitable material. For example, the substrate may be formed from fused silica, glass, YAG or $CaF_2$.

The master imprint template 25 may be, for example, formed from quartz, fused silica, glass, YAG or $CaF_2$. The master imprint template 25 may include an inorganic release layer.

The imprintable medium 24 may be, for example, a silicon containing material or a non-silicon containing material. The imprintable medium may be, for example, SFIL resist.

An embodiment of the present invention differs from the method described in U.S. Patent Application Publication No. 2008/0011934 in one or more ways. For example, in US 2008/0011934, a pattern is imprinted into a sol-gel and the sol-gel is then hardened. An embodiment of the invention imprints a pattern into imprintable medium, then etches the pattern into the inorganic release layer. Sol-gel may be susceptible to changes of dimension when it is hardening, which may mean, for example, that the distance between two points on a pattern formed in the sol-gel differs from the desired distance. This problem may be avoided by an embodiment of the invention, since the inorganic release layer 21 is solid when it is etched.

The pattern used in US 2008/0011934 to form the pattern in the sol-gel layer is PDMS. Unwanted changes of dimension of the PDMS pattern may arise. This problem may be avoided by an embodiment of the invention, where a master imprint template is formed from quartz (or some other material which is less susceptible to changes of dimension than, e.g., PDMS).

Changes of dimension of the pattern formed in the sol-gel layer could occur due to swelling which arises from diffusion of an organic compound into the sol-gel. This problem may be avoided by an embodiment of the invention, where a master imprint template is formed from quartz (or some other non-organic material) and/or the use of the inorganic release layer (or other material which is less susceptible than sol-gel to swelling due to diffusion of organic compounds).

Another problem associated with using sol-gel to form an imprint template is that the sol-gel is quite flexible. In contrast, an imprint template formed using an embodiment of the invention may be less flexible than sol-gel. The imprint template formed using an embodiment of the invention thus may allow more accurate patterning to be achieved.

An imprint template formed using an embodiment of the invention may be used, for example, for the manufacture of devices, such as electronic devices and integrated circuits. An imprint template formed using an embodiment of the invention may be used, for example, in the manufacture of integrated optical systems, guidance and detection patterns for magnetic domain memories, flat-panel displays, liquid-crystal displays (LCDs), thin film magnetic heads, organic light emitting diodes, etc.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. A method of forming an imprint template, the method comprising:

using a master imprint template to imprint a pattern into a first imprintable medium layer overlying an inorganic release layer, wherein the inorganic release layer overlies a substrate without an organic material layer between the inorganic release layer and the substrate at the time of imprinting;

causing the first imprintable medium to solidify; and etching the first imprintable medium and the inorganic release layer to form a pattern in the inorganic release layer of the imprint template, the imprint template configured to imprint a second imprintable medium in a sub-micron imprint lithography process, and the pattern of the inorganic release layer having a sub-micron protrusion to directly contact the second imprintable medium and the inorganic release layer is formed from one of: $SiN_x$, $AlN_x$, $TiN_x$, $TiO_x$, $AlO_x$, $TaO_x$, or $GaN_x$.

2. The method of claim 1, wherein a hard mask is on top of the inorganic release layer, and the method further comprises etching the hard mask.

3. The method of claim 2, wherein the hard mask is formed from one of: Cr, Mo, WSi, W, Al, Si or Ti.

4. The method of claim 1, wherein an adhesion layer is beneath the layer of first imprintable medium, and the method further comprises etching the adhesion layer.

5. The method of claim 1, wherein the master imprint template is formed from quartz, fused silica, glass, YAG or $CaF_2$.

6. The method of claim 1, wherein the substrate is formed from quartz, fused silica, glass, YAG or $CaF_2$.

7. The method of claim 1, wherein the etch does not penetrate through the inorganic layer to the substrate.

8. The method of claim 2, further comprising using an etch to remove the hard mask.

9. An imprint template comprising a substrate of a first material and an inorganic release layer, of a second material different than the first material, overlying the substrate without an organic material layer between the inorganic release layer and the substrate, a pattern being present in the inorganic release layer of the imprint template, the imprint template configured to imprint an imprintable medium in a sub-micron imprint lithography process and the pattern of the inorganic release layer, comprising a sub-micron protrusion to directly contact the imprintable medium, having been formed in the inorganic release layer using etching and the inorganic release layer is formed from one of: $SiN_x$, $AlN_x$, $TiN_x$, $TiO_x$, $AlO_x$, $TaO_x$, or $GaN_x$.

10. The imprint template of claim 9, wherein the substrate is not patterned.

11. The imprint template of claim 9, wherein the substrate is formed from quartz, fused silica, glass, YAG or $CaF_2$.

12. The imprint template of claim 10, wherein the substrate is transparent or translucent.

13. The imprint template of claim 10, wherein the substrate is formed from quartz, fused silica, glass, YAG or $CaF_2$.

14. The method of claim 1, wherein the substrate is transparent or translucent.

15. The method of claim 7, wherein the substrate is transparent or translucent.

16. The method of claim 1, further comprising imprinting the imprint template into a layer of the second imprintable medium.

17. A method of manufacturing a device, the method comprising:

imprinting an imprint template into an imprintable medium as part of a sub-micron imprint lithography process, the imprint template comprising a substrate of a first material and an inorganic release layer, of a second material different than the first material, overlying the substrate without an organic material layer between the inorganic release layer and the substrate, a pattern being present in the inorganic release layer, the pattern having been formed in the inorganic release layer using etching and comprising a sub-micron protrusion directly contacting the imprintable medium, wherein the inorganic release layer is formed from one of: $SiN_x$, $AlN_x$, $TiN_x$, $TiO_x$, $AlO_x$, $TaO_x$, or $GaN_x$.

18. The method of claim 17, wherein the substrate is transparent or translucent.

* * * * *